(12) United States Patent
Bharadwaj

(10) Patent No.: US 10,582,631 B2
(45) Date of Patent: Mar. 3, 2020

(54) HOUSINGS FORMED FROM THREE-DIMENSIONAL CIRCUITS

(71) Applicant: Apple Inc., Cupertino, CA (US)

(72) Inventor: Shravan Bharadwaj, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/655,311

(22) Filed: Jul. 20, 2017

(65) Prior Publication Data

US 2019/0029136 A1  Jan. 24, 2019

(51) Int. Cl.
| | |
|---|---|
| *H05K 5/02* | (2006.01) |
| *H05K 1/03* | (2006.01) |
| *H05K 1/09* | (2006.01) |
| *H05K 3/10* | (2006.01) |
| *H05K 3/32* | (2006.01) |
| *G06F 1/16* | (2006.01) |
| *H04M 1/18* | (2006.01) |
| *H05K 1/02* | (2006.01) |
| *H05K 3/00* | (2006.01) |
| *H05K 3/46* | (2006.01) |

(52) U.S. Cl.
CPC ......... *H05K 5/0247* (2013.01); *G06F 1/1633* (2013.01); *G06F 1/1656* (2013.01); *H04M 1/18* (2013.01); *H04M 1/185* (2013.01); *H05K 1/0284* (2013.01); *H05K 1/0366* (2013.01); *H05K 1/092* (2013.01); *H05K 3/10* (2013.01); *H05K 3/32* (2013.01); *H05K 3/0014* (2013.01); *H05K 3/4611* (2013.01); *H05K 2201/0999* (2013.01)

(58) Field of Classification Search
None
See application file for complete search history.

(56) References Cited

U.S. PATENT DOCUMENTS

| | | | | |
|---|---|---|---|---|
| 5,474,834 A | * | 12/1995 | Tanahashi | H01L 23/49888 257/E23.076 |
| 5,568,365 A | * | 10/1996 | Hahn | H05K 5/0247 361/752 |
| 5,876,538 A | * | 3/1999 | Steinle | H01L 21/4857 156/89.14 |
| 6,538,211 B2 | | 3/2003 | St. Lawrence et al. | |
| 6,998,704 B2 | | 2/2006 | Yamakazi et al. | |
| 7,349,225 B1 | * | 3/2008 | Bennett | H05K 1/144 174/250 |
| 8,373,664 B2 | | 2/2013 | Wright | |
| 8,552,299 B2 | | 10/2013 | Rogers et al. | |
| 8,808,483 B2 | | 8/2014 | Sung et al. | |
| 9,266,310 B2 | | 2/2016 | Krogdahl et al. | |
| 9,409,383 B2 | | 8/2016 | Feinstein et al. | |
| 9,787,934 B2 | | 10/2017 | Lang | |

(Continued)

*Primary Examiner* — Xanthia C Cunningham
(74) *Attorney, Agent, or Firm* — Brownstein Hyatt Farber Schreck, LLP

(57) ABSTRACT

A housing made from a circuit laminate includes first and second layers coupled together. Each includes a rigid, electrically insulating non-planar structural layer, flexible conductive traces disposed on surfaces of the structural layer, and flexible connector layers contacting to the flexible conductive traces. The housing may be formed from the circuit laminate using thermoforming or another process that co-molds the first and second layers. The structural layers stiffen the housing and/or form an environmental or other barrier so that the housing protects an internal component.

20 Claims, 17 Drawing Sheets

(56) References Cited

U.S. PATENT DOCUMENTS

| | | | |
|---|---|---|---|
| 2004/0124405 A1* | 7/2004 | Sethumadhavan | B32B 15/04 |
| | | | 257/1 |
| 2004/0147113 A1* | 7/2004 | Yamazaki | H01L 21/288 |
| | | | 438/660 |
| 2005/0210722 A1* | 9/2005 | Graef | G09F 9/30 |
| | | | 40/452 |
| 2005/0266758 A1* | 12/2005 | Nishikori | D21H 13/40 |
| | | | 442/327 |
| 2009/0045499 A1* | 2/2009 | Kim | H01L 25/0657 |
| | | | 257/691 |
| 2011/0005662 A1 | 1/2011 | Sung | |
| 2011/0079349 A1* | 4/2011 | Cho | H05K 3/4682 |
| | | | 156/247 |
| 2013/0127480 A1 | 5/2013 | Cuseo et al. | |
| 2013/0277096 A1* | 10/2013 | Seong | C09D 11/52 |
| | | | 174/257 |
| 2014/0272201 A1 | 9/2014 | Takeda et al. | |
| 2014/0273632 A1* | 9/2014 | Kim | H01Q 1/12 |
| | | | 439/620.01 |
| 2015/0195935 A1* | 7/2015 | Shibayama | H01L 23/053 |
| | | | 361/807 |
| 2015/0311655 A1* | 10/2015 | Han | H05K 5/0247 |
| | | | 455/558 |
| 2016/0118634 A1* | 4/2016 | Thiel | A41D 1/002 |
| | | | 429/99 |
| 2016/0174294 A1* | 6/2016 | Yang | H05K 5/0247 |
| | | | 370/338 |
| 2017/0020012 A1* | 1/2017 | Park | H04B 1/3888 |
| 2017/0034932 A1* | 2/2017 | Rostami | H02J 7/0045 |
| 2017/0200702 A1* | 7/2017 | Hung | H01L 25/0657 |
| 2017/0245567 A1* | 8/2017 | Fathollahi | H02J 7/0042 |
| 2017/0279125 A1* | 9/2017 | Ohsawa | H01M 4/02 |
| 2018/0011565 A1 | 1/2018 | Nekimken et al. | |
| 2019/0008060 A1* | 1/2019 | Sreenivasan | H05K 5/0247 |

\* cited by examiner

HOUSINGS FORMED FROM THREE-DIMENSIONAL CIRCUITS

FIELD

The described embodiments relate generally to three-dimensional circuit laminates. More particularly, the present embodiments relate to housings, enclosures, and/or other support structures formed from three-dimensional circuit laminates.

BACKGROUND

Electronic devices include devices such as laptop computing devices, smart phones, wearable devices, desktop computing devices, cellular telephones, mobile computing devices, tablet computing devices, and so on. Many electronic devices include one or more electronic components such as circuit boards enclosed by one or more housings or other enclosures.

Typically, the electronic components may be operable to perform various of the functions of the electronic device. Similarly, the housings or other enclosures provide structural support to protect the electronic components from impacts, environmental contaminants, and so on.

As technology progresses, many electronic devices are designed to be smaller, lighter, and/or include more and/or more advanced components. The components that are included in an electronic device may contribute to size, weight, and cost of the electronic device.

SUMMARY

The present disclosure relates to forming housings, enclosures, and/or other support structures from circuit laminates. A circuit laminate may include layers of electrically insulating structural layers with flexible conductive traces formed thereon that are separated by flexible connector layers. The circuit laminate may be thermoformed or otherwise processed into a non-planar shape, causing the structural layers to be rigid and/or otherwise stiffen a housing, enclosure, or other structure formed from the circuit laminate. In this way, housings may be operable to function electrically at the same time that they provide structural support in a variety of non-planar shapes.

In some implementations, an enclosure for an electronic device includes a first structural layer, a first flexible conductive trace formed on the first structural layer, a second structural layer, a second flexible conductive trace formed on the second structural layer, and a flexible connector layer disposed between the first and second flexible conductive traces separating the first and second structural layers. The first and second structural layers stiffen the enclosure.

In various examples, the enclosure further includes an electronic component that is coupled to the enclosure and electrically coupled to at least one of the first flexible conductive trace, the second flexible conductive trace, or the flexible connector layer. In some examples, the enclosure further includes an electrically non-conductive material that encapsulates at least part of the first structural layer or the second structural layer. In numerous examples, at least one of the first and second flexible conductive traces is conductive ink. In various examples, the enclosure further includes a flexible, electrically non-conductive metal layer coupled to the first structural layer. In some examples, the first structural layer and the second structural layer are non-planar.

In various implementations, a circuit laminate includes first and second layers coupled together, the first and second layers each including a rigid, electrically insulating non-planar structural layer that reinforces a housing or internal component of an electronic device, the rigid, electrically insulating non-planar structural layer having opposing first and second surfaces; first and second flexible conductive traces disposed on the first and second surfaces; and first and second flexible connector layers respectively coupled to the first and second flexible conductive traces. In some examples, the circuit laminate further includes an encapsulant that surrounds at least a portion of the first and second layers.

In numerous examples, the rigid, electrically insulating non-planar structural layer is at least one of carbon fiber, aramid fiber, glass-reinforced epoxy, fiber reinforced plastic, or prepreg. In various examples, the first and second flexible conductive traces are conductive silver ink or conductive copper ink. In some examples, the first and second flexible connector layers are a metal foil or film.

In various examples, the rigid, electrically insulating non-planar structural layer of the first layer is a different material than the rigid, electrically insulating non-planar structural layer of the second layer. In numerous examples, the circuit laminate defines a curved portion of the housing.

In numerous implementations a method for forming a circuit assembly includes forming a first sheet, forming a second sheet, and thermoforming the first and second sheets to create a circuit laminate. The first sheet may be formed by providing a first structural layer, printing first circuit traces on the first structural layer, and contacting a first connector layer to the first circuit traces. The second sheet may be formed by providing a second structural layer, printing second circuit traces on the second structural layer, and contacting a second conductive connector layer to the second circuit traces, and thermoforming the first and second sheets to create a circuit laminate.

In some examples, thermoforming the first and second sheets to create the circuit laminate further includes thermoforming the first and second sheets to create a non-planar circuit laminate. In numerous examples, the thermoforming configures the circuit laminate as a structural component.

In various examples, the method further includes covering at least a portion of the first and second sheets with an electrically insulating material. The covering may be performed subsequent to the thermoforming. In some examples, the method further includes electrically connecting an electronic component to the first circuit traces. In numerous examples, the method further includes removing a portion of the circuit laminate.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
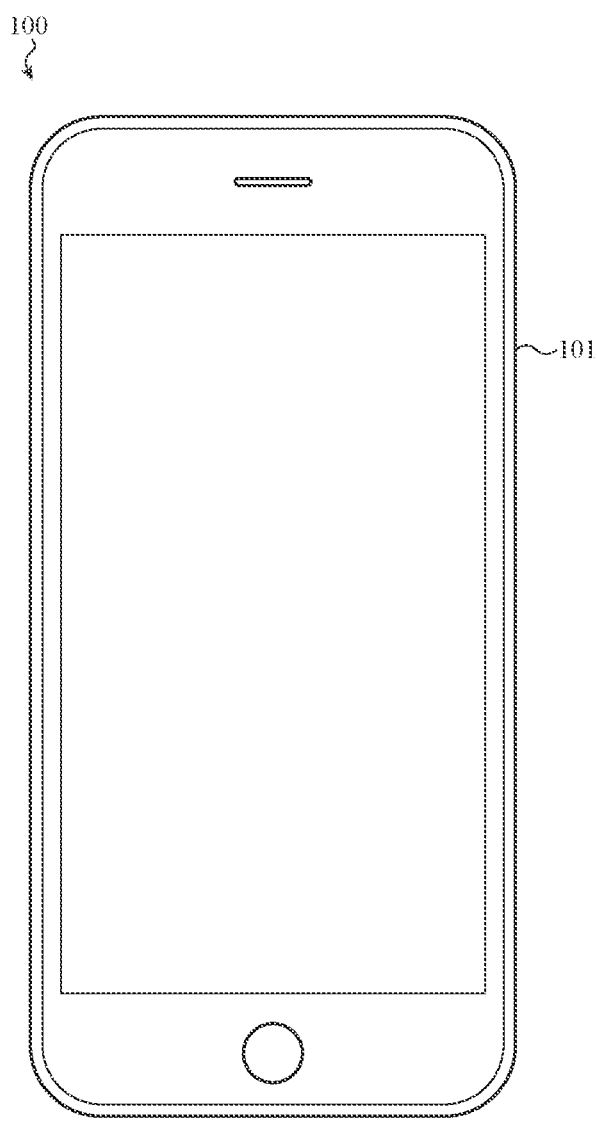
FIG. 1A depicts an example electronic device that includes a housing formed of a three-dimensional circuit laminate.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, and apparatuses that embody various elements of the present disclosure. However, it should be understood that the described disclosure may be practiced in a variety of forms in addition to those described herein.

The following disclosure relates to housings, enclosures, and/or other support structures formed of circuit laminates. A circuit laminate may include multiple layers. Each layer may include electrically insulating structural layers. Flexible conductive traces may be formed on the structural layers. Flexible connector layers may be disposed between the flexible conductive traces of different layers. The layers may be coupled together and thermoformed, or otherwise processed, to form a non-planar shape in which the structural layers are rigid and/or otherwise stiffen a housing formed from the circuit laminate. In this way, the circuit laminates may function electrically at the same time that they provide structural support. They may also assume a variety of non-planar shapes. This may reduce the number of components in an electronic device, reduce the space between components of an electronic device, increase space defined within a housing of an electronic device, and/or otherwise allow for greater flexibility in the selection and design of components of an electronic device. The flexible conductive traces may be stretchable, in many embodiments.

In various implementations, the circuit laminates may be at least partially encapsulated, coated, surrounded, or covered by one or more encapsulants. Examples of encapsulants may include, but are not limited to various polymers, plastics, various electrically non-conductive or electrically insulating materials, and so on.

In some implementations, the structural layers may be any kind of material that may be operable to provide structural support such as carbon fiber; fiber reinforced plastic; prepreg; para-aramid fiber; epoxy; glass-reinforced epoxy; aramid fiber; liquid crystal polymer fiber; fabric; thermoplastic weave; flexible, electrically non-conductive metal (such as anodized aluminum); glass fiber; other structural fibers, fiber sheets, or fiber weaves; and so on. The structural layers may be flexible but may be processed (such as by thermoforming) to become rigid or stiff in order to provide structural support to an enclosure, housing, or other structure.

In numerous implementations, the flexible connector layers may be one or more flexible or stretchable conductors such as one or more foils, films, flex, or similar structures. The flexible connector layers may be patterned or otherwise configured to connect to the appropriate flexible conductive traces and thereby electrically connect different layers. Similarly, the flexible conductive traces may be one or more flexible or stretchable conductors such as one or more flexible or stretchable conductive inks. For example, flexible or stretchable conductive inks may be formed by combining conductive material such as copper, silver, and so on with one or more elastomers or other flexible materials. The ratio between such conductive material and the flexible material may determine various characteristics of the ink such as conductivity, flexibility, durability, thermal resistance, and so on. In some examples, conductive ink may be printed on fiber prior to the fiber being woven, or otherwise assembled, into a sheet or similar structure. In other examples, the conductive ink may be printed onto a sheet after it is formed from constituent fibers.

These and other embodiments are discussed below with reference to FIGS. 1A-11. However, those skilled in the art will readily appreciate that the detailed description given herein with respect to these Figures is for explanatory purposes only and should not be construed as limiting.

FIG. 1A depicts an example electronic device 100 that includes a housing 101 or enclosure formed of a three-dimensional circuit laminate. The three-dimensional circuit laminate may be formed of a number of stack layers of rigid structural layers, flexible and/or stretchable conductive traces, stretchable and/or flexible connector layers, and so on. A material may be rigid if the material maintains an initial shape during normal use absent the exertion of force sufficient to alter the initial shape, whereupon the material does not return to the initial shape when the force is no longer exerted and/or was damaged by the force. Examples of rigid materials include structural components that provide mechanical support or other mechanical functions, such as plastic or metal housings, midplates, bosses, and so on. A material may be flexible if the material deforms from an initial shape without being damaged when force is exerted and substantially returns to the initial shape when the force is no longer exerted. In some embodiments, flexible materials (traces, layers, and the like) discussed herein may be both flexible and stretchable. A material is stretchable if it changes dimension without being damaged when force is exerted and substantially returns to its initial dimension when the force is no longer exerted. Examples of flexible and/or stretchable materials include materials such as rubber, some elastomers, and so on. The three-dimensional circuit laminate may function electrically within the electronic device 100 at the same time that the three-dimensional circuit laminate provides rigidity, stiffness, and/or other structural support or protection for the electronic device 100 and/or internal components thereof.

Figure 1B:
FIG. 1B depicts a side view of the example electronic device of FIG. 1A.
Figure 1C:
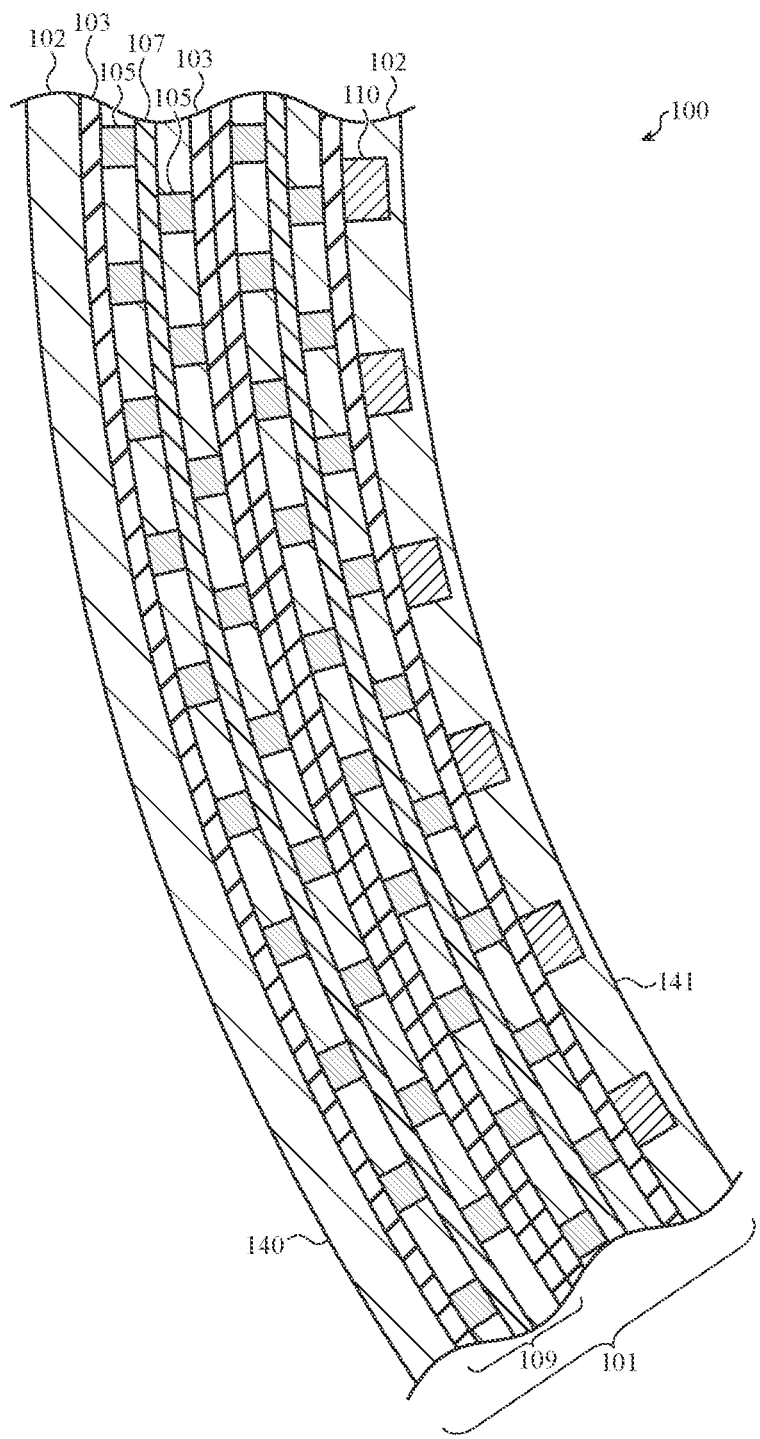
FIG. 1C depicts a partial cross-sectional view of the housing of the example electronic device of FIGS. 1A-1B, taken along line A-A of FIG. 1B.

FIG. 1B depicts a side view of the example electronic device 100 of FIG. 1A. FIG. 1C depicts a partial cross-sectional view of the housing 101 or enclosure of the example electronic device 100 of FIGS. 1A-1B, taken along line A-A of FIG. 1B.

As shown in FIG. 1C, the housing 101 includes a circuit laminate formed of a number of stack layers 109. Each layer may include electrically insulating structural layers 107, flexible conductive traces 105 formed on the structural layers 107, and flexible connector layers 103. The flexible conductive traces 105 may perform electrical routing within stack layers 109. Similarly, the flexible connector layers 103 of adjacent stack layers 109 may electrically connect the respective flexible conductive traces 105 of the adjacent stack layers 109, and thus the adjacent stack layers 109 themselves, performing electrical routing between stack layers 109. Although the flexible connector layers 103 are illustrated as sheets, it is understood that this is for the sake of simplicity. The flexible connector layers 103 may be patterned or otherwise configured to connect to the appropriate flexible conductive traces 105 of a stack layer 109 and to other stack layers 109 without connecting all flexible conductive traces 105 together and shorting the flexible conductive traces 105, the flexible connector layers 103, and/or the entire circuit laminate. The stack layers 109 may be coupled together and may have been thermoformed, or otherwise processed, to form a non-planar shape. One such non-planar shape is a curved portion defined by the housing 101 illustrated in FIG. 1C. The structural layers 107 may be rigid and/or otherwise stiffen or reinforce the overall housing 101.

In this way, the circuit laminate may function electrically at the same time that it provides structural support in a non-planar shape. For example, the flexible conductive traces 105 and/or the flexible connector layers 103 may electrically connect between stack layers 109, to internal and/or external components, route signals or power, form a component such as an inductive power receiver, and so on. In other words, components of the circuit laminate may perform functions related to one or more electronic circuits. This may reduce the number of components that would otherwise be included in the electronic device 100, reduce the space that would otherwise be positioned between components of the electronic device 100, increase internal space defined within the housing 101 as compared to a similarly sized device with a standard housing structure, and/or otherwise allow for greater flexibility in the selection and design of components of the electronic device 100.

The circuit laminate may be at least partially encapsulated, coated, surrounded, or covered by one or more encapsulants 102. Examples of encapsulants 102 may include, but are not limited to, various polymers, plastics, electrically non-conductive or electrically insulating materials, and so on.

The housing 101 may define an exterior surface 140 of the electronic device 100 that faces an exterior environment. The housing 101 may also define an interior surface 141 of the electronic device 100 that faces an interior of the electronic device 100. As shown, the encapsulant 102 may define the interior surface 141 and/or the exterior surface 140. However, in other implementations, the circuit laminate and/or other components may define the interior surface 141 and/or the exterior surface 140.

The circuit laminate and/or the structural layers 107 and/or various other components may function to protect the electronic device 100 and/or components thereof in various ways. For example, the circuit laminate may provide structural support that protects against impact, falls, or other potential damage. By way of another example, the circuit laminate may form a barrier against water, moisture, and/or other environmental contaminants that may damage internal components and so on.

Various electronic components 110 may be coupled to various portions of the circuit laminate. The electronic components 110 may be physically coupled to various portions of the circuit laminate and may be electrically coupled to the flexible conductive traces 105 and/or flexible connector layers 103 of various stack layers 109 by various electrical connection mechanisms such as one or more vias or other conductive material that links various flexible conductive traces 105 and/or flexible connector layers 103 of various stack layers 109. The electronic components 110, flexible conductive traces 105, and/or flexible connector layers 103 may also be electrically coupled to various other components of the electronic device 100. As also illustrated, electronic components 110 may be interspersed with flexible conductive traces 105 in any of the multiple stack layers 109.

In some embodiments, the electronic component(s) 110 may be one or more of a camera, sensor (including a biometric sensor), switch, processing unit, battery, antenna, or the like. One or more openings may be formed in one or more of the stack layers 109 and/or encapsulants, above any such electronic component in order to facilitate functionality of the component. For example, openings may be formed in layers above the camera, as well as in any encapsulant, in order to permit light to pass from an exterior of an electronic device into the camera. It should be appreciated that some of these openings may be filled with any suitable material, such as an optically transparent material, in order to seal the circuit laminate and protect the electronic component 110 while permitting the component to function. In the example where the electronic component is a camera, an optically-transparent material may fill such openings. Where the electronic component is an antenna, the opening(s) may be air gaps in order to isolate the antenna from interference caused by other electronic components, and vice versa.

In some embodiments, a single electronic component may occupy, or be distributed between, multiple stack layers 107. A battery may be formed from multiple storage cells, each in a separate stack layer 107, and all interconnected as described elsewhere herein.

The structural layers 107 may be any kind of material that provides structural support as part of a housing or other external or internal structure (such as one or more midplates, bosses, internal wall ledges, and so on). This may include, but is not limited to, carbon fiber; fiber reinforced plastic; prepreg; para-aramid fiber; epoxy; glass-reinforced epoxy; aramid fiber; liquid crystal polymer fiber; fabric; thermoplastic weave; flexible, electrically non-conductive metal (such as anodized aluminum); glass fiber; other structural fibers, fiber sheets, or fiber weaves; and so on. In various implementations, the structural layers 107 may be formed of a material that is flexible but may be processed (such as by thermoforming) to become rigid or stiff.

The flexible connector layers 103 may be one or more foils (such as a metal foil), films (such as a metal film), flex, or similar structures. Similarly, the flexible conductive traces 105 may be one or more conductive inks. For example, flexible or stretchable conductive inks may be formed by combining conductive material such as nanoparticle and/or other copper, nanoparticle and/or other silver, and so on with one or more elastomers or other flexible materials such as silicone. The ratio between such conductive material and the flexible material may determine various characteristics of the ink such as conductivity, flexibility, durability, thermal resistance (such as to a process to which the circuit laminate is subjected, like thermoforming), and so on. For example, increasing the proportion of flexible material may increase flexibility at the same time that it reduces conductivity and thermal resistance. Similarly, increasing the proportion of conductive material may increase conductivity and thermal resistance at the same time that it reduces flexibility.

Although FIGS. 1A-1C illustrate the electronic device 100 as a smart phone, it is understood that this is an example. In various implementations, a housing 101 or enclosure formed of a three-dimensional circuit laminate may be used in a variety of different devices. Examples of such devices include, but are not limited to a desktop computing device, a laptop computing device, a wearable device, a printer, a display, a tablet computing device, a mobile computing device, a kitchen appliance, a digital media player, and so on.

In numerous implementations, the circuit laminate may be used to form a variety of different structures. For example, the circuit laminate may be used to form an enclosure for an electronic device that includes vias or other contacts on an external surface for routing electrical signals or power through the enclosure to one or more internal components.

In other examples, the circuit laminate may form a contiguous housing or other structure having a complex shape including one or more planar regions and one or more non-planar regions. Some regions may be locally thinned, such as in implementations where different regions are formed using different numbers of layers. Features such as openings or depressions may be formed in the housing. Exposed contacts or other electrical connections may be disposed in such features to allow for modular swapping of various device capabilities, repair, and so on.

FIGS. 2A-2G depicts a first operation in an example process for forming a three-dimensional circuit laminate structure 201. In a first operation depicted in FIG. 2A, a structural layer 207 or other structure is provided. In a second operation depicted in FIG. 2B, conductive traces 205 made of a stretchable conductor are formed on the structural layer 207.

For example, the structural layer 207 is shown as having first and second opposing surfaces. The conductive traces 205 may be conductive ink that is printed on one or more of the opposing first and second surfaces of the structural layer 207.

Figure 2A:
FIG. 2A depicts a first operation in an example process for forming a three-dimensional circuit laminate structure, in which a structural layer is provided.
Figure 2B:
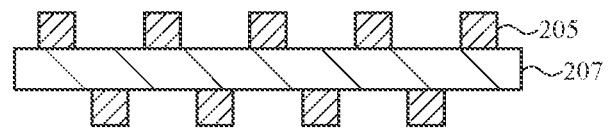
FIG. 2B depicts a second operation in the example process for forming a three-dimensional circuit laminate structure, in which conductive traces made from a stretchable conductor are formed on the structural layer.
Figure 2C:
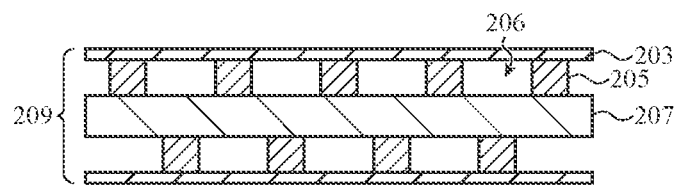
FIG. 2C depicts a third operation in the example process for forming a three-dimensional circuit laminate structure, in which flexible connector layers contact the conductive traces, forming a first circuit stack layer.

In a third operation shown in FIG. 2C, flexible connector layers 203 contact the conductive traces 205 (which may define gaps 206 between the conductive traces 205 and/or the flexible connector layers 203). For example, the flexible connector layers 203 may be one or more conductive foils, films, flex, and so on that contact the conductive traces 205.

Figure 2D:
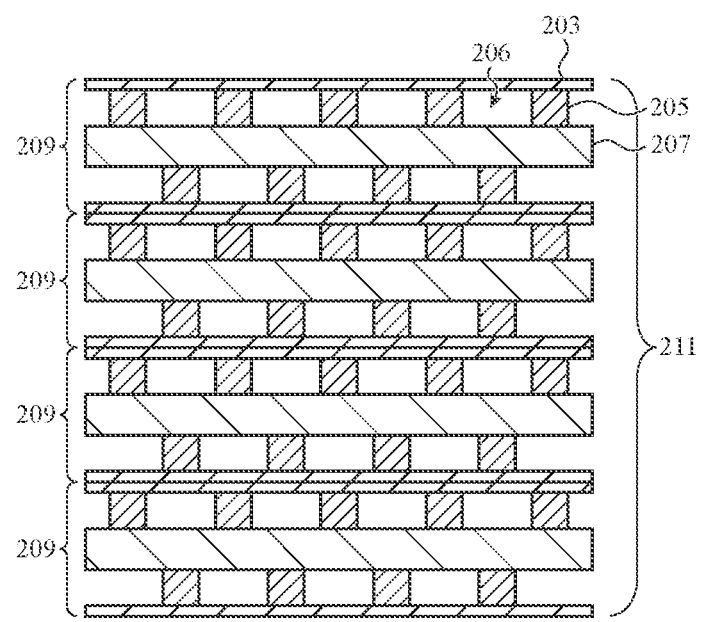
FIG. 2D depicts a fourth operation in the example process for forming a three-dimensional circuit laminate structure, in which multiple layers like the first stack layer of FIG. 2C are combined into a circuit stack.

These operations depicted in FIGS. 2A-2C may form a first circuit stack layer 209. Multiple circuit stack layers 209 may be coupled and/or otherwise stacked together to form a circuit stack 211, as depicted in FIG. 2D.

In such a circuit stack 211, the flexible conductive traces 205 may perform electrical routing within the circuit stack layers 209. Similarly, the flexible connector layers 203 of adjacent circuit stack layers 209 may electrically connect the respective flexible conductive traces 205 of the adjacent circuit stack layers 209 and thus electrically connect the adjacent circuit stack layers 209, performing electrical routing between circuit stack layers 209. Although the flexible connector layers 203 are illustrated as sheets, it is understood that this is for the sake of simplicity. The flexible connector layers 203 may be patterned or otherwise configured to connect to the appropriate flexible conductive traces 205 of a circuit stack layers 209 and to other circuit stack layers 209 in a way that does not electrically connect all flexible conductive traces 105 together, shorting the flexible conductive traces 205, the flexible connector layers 203, and/or the entire circuit stack 211 or a circuit laminate formed therefrom.

In some implementations, the differences between how the flexible connector layers 203 and the flexible conductive traces 205 are configured may allow for greater manufacturing tolerances, allow the flexible connector layers 203 and the flexible conductive traces 205 to remain appropriately electrically coupled during subsequent processing (such as thermoforming), and so on. For example, portions of the flexible connector layers 203 that contact the flexible conductive traces 205 may be wider than the flexible conductive traces 205. This may allow the flexible connector layers 203 and the flexible conductive traces 205 to contact without as precise of placement as if the flexible conductive traces 205 were directly contacted to the flexible conductive traces 205 of other circuit stack layers 209. Further, such differing dimensions and/or other properties of the flexible connector layers 203 and/or the flexible conductive traces 205 (such as in implementations where the flexible connector layers 203 contact the flexible conductive traces 205 but are not affixed thereto) may allow the flexible connector layers 203 and the flexible conductive traces 205 to remain appropriately electrically coupled during subsequent processing (such as thermoforming) whereas interconnections between directly affixed flexible conductive traces 205 of adjacent circuit stack layers 209 could be electrically disconnected or damaged during such processing.

Figure 2E:
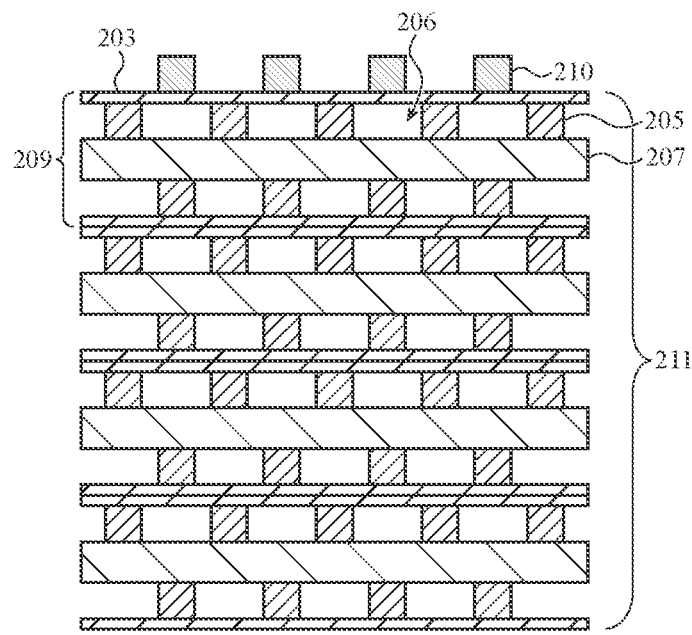
FIG. 2E depicts a fifth operation in the example process for forming a three-dimensional circuit laminate structure, in which one or more electronic components are coupled to the circuit stack of FIG. 2D.

Electronic components 210 (as shown in FIG. 2E) may be coupled and/or otherwise electrically connected to various portions of the circuit stack 211. In various examples, the electronic components 210 may be coupled to the circuit stack 211 using surface mount technology (SMT), pick and place (PnP) technology, and/or various other techniques.

Figure 2F:
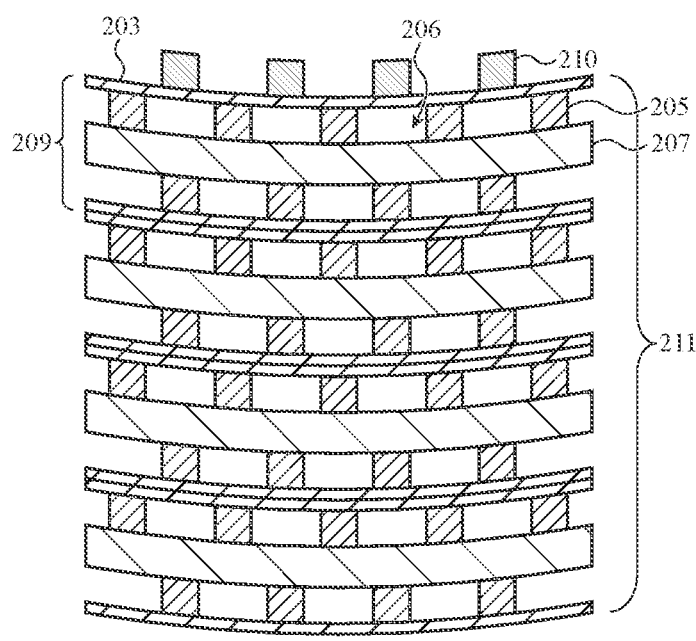
FIG. 2F depicts a sixth operation in the example process for forming a three-dimensional circuit laminate structure, in which the circuit stack of FIG. 2E is thermoformed to produce a non-planar structure.

FIG. 2F depicts a sixth operation where the circuit stack 211 may be thermoformed in a mold or otherwise processed to produce a non-planar structure. The flexibility and/or stretchable characteristics of the conductive traces 205 and/or the flexible connector layers 203 may prevent the shape alteration, temperatures, and/or other aspects of the thermoforming and/or other processing from damaging and/or disrupting the conductive traces 205 and/or the flexible connector layers 203. In some implementations, the structural layer 207 may be flexible prior to thermoforming and the thermoforming may cause the structural layer 207 to become relatively more rigid or stiff.

The structural layer 207 may be flexible prior to thermoforming if the structural layer 207 deforms from an initial shape prior to thermoforming without being damaged when force is exerted and returns to the initial shape when the force is no longer exerted. The structural layer 207 may be rigid or stiff after if the structural layer 207 maintains an initial shape during normal use after thermoforming absent the exertion of force sufficient to alter the initial shape, whereupon the structural layer 207 does not return to the initial shape when the force is no longer exerted and/or was damaged by the force.

For example, the structural layer 207 may be operable after thermoforming to maintain or otherwise hold the molded non-planar shape absent external support. The thermoforming may configure the circuit stack 211 as a structural component.

Figure 2G:
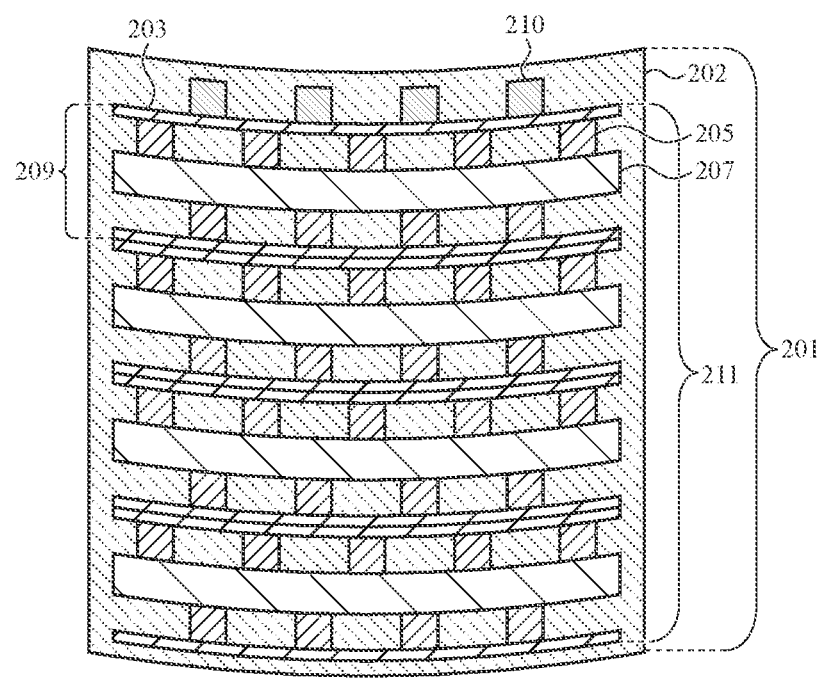
FIG. 2G depicts a seventh operation in the example process for forming a three-dimensional circuit laminate structure, in which the non-planar structure is at least partially encapsulated and/or otherwise coated or covered with an encapsulant.

FIG. 2G depicts a seventh operation where the non-planar structure is at least partially encapsulated and/or otherwise coated, surrounded, or covered with an encapsulant 202. This may produce a three-dimensional circuit laminate structure 201. This may also fill in one or more of the gaps 206 with the encapsulant 202, removing the gap 206.

In some implementations, the encapsulation may leave one or more portions of the circuit stack 211 exposed to allow for electrical connection. In other implementations, the encapsulation may not leave such portions exposed and the encapsulant 202 may subsequently be breached and/or otherwise altered to allow for electrical connection to various portions of the circuit stack 211.

Although the above illustrates and describes the three-dimensional circuit laminate structure 201 as being fully formed after encapsulation in FIG. 2G, it is understood that this is an example. In various implementations, encapsulation may be omitted. In such an implementation, the three-dimensional circuit laminate structure 201 may be complete when thermoformed and/or otherwise processed into the non-planar shape shown in FIG. 2F. Various configurations are possible and contemplated.

Further, although FIG. 2G illustrates the circuit stack 211 as fully encapsulated, it is understood that this is an example. In various implementations, the circuit stack 211 may be partially encapsulated. For example, in some examples, encapsulation may leave the electronic components 210 and/or one or more surfaces to which the electronic components 210 are attached exposed. In other examples, one or more shields may be used to cover and/or otherwise block the encapsulant 202 from one or more of the electronic components 210 to prevent the encapsulant 202 and/or temperatures involved in the encapsulation process from damaging one or more of the electronic components 210.

Additionally, the above describes coupling the electronic components 210 to the circuit stack 211 subsequent to thermoforming and prior to encapsulation. However, in various examples, the electronic components 210 may be coupled to the circuit stack 211 prior to thermoforming or other similar processing, after encapsulation, prior to coupling of the circuit stack layers 209, and so on. Various arrangements are possible and contemplated.

In examples where the electronic components 210 are coupled prior to thermoforming, coupling may be simplified as the electronic components 210 may be coupled to a two-dimensional surface of the circuit stack 211. Coupling the electronic components 210 to the same surface subsequent to thermoforming may be more complex as the same surface may then be curved and/or otherwise three-dimensional. In such an example, various mechanisms such as a 5-axis robot, multi-axis precision gantry, and so on may be used to place the electronic components 210.

Moreover, although not illustrated or discussed above, formation of the three-dimensional circuit laminate structure 201 and/or the circuit stack 211 may also involve electrically interconnecting one or more of the circuit stack layers 209, conductive traces 205, flexible connector layers 203, electronic components 210, and/or other electronic components or structures. For example, one or more vias or other electrical connections may be formed through and/or one or more conductive materials may be formed around one or more structural layers 207 to electrically interconnect one or more of the circuit stack layers 209, conductive traces 205, flexible connector layers 203, and/or electronic components 210.

In various implementations, the three-dimensional circuit laminate structure 201 and/or the circuit stack 211 may be used to form a housing, enclosure, or similar structure of an electronic device. In other implementations, the three-dimensional circuit laminate structure 201 and/or the circuit stack 211 may be used to form an internal support structure for an electronic device, a circuit laminate that does not perform a structural function in an electronic device, and so on. Various configurations are possible and contemplated.

Further, although a particular sequence of operations and a particular arrangement of components is illustrated and described above with respect to FIGS. 2A-2G, it is understood that these are examples. In other implementations, various arrangements of components may be assembled in various sequences without departing from the scope of the present disclosure.

Figure 3:
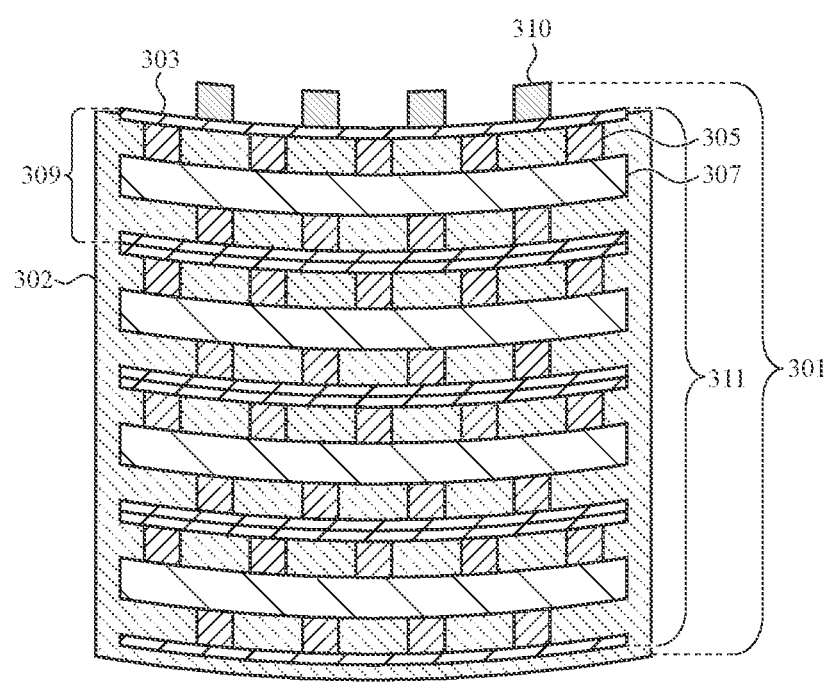
FIG. 3 depicts an embodiment of a three-dimensional circuit laminate structure, like that of FIG. 2F or 2G, in which the three-dimensional circuit laminate structure is partially rather than fully encapsulated.

For example, the above illustrates and describes the circuit stack 211 as fully encapsulated. However, FIG. 3 depicts an embodiment of a three-dimensional circuit laminate structure 301, like that of FIG. 2F or 2G, in which the three-dimensional circuit laminate structure 301 is partially rather than fully encapsulated. As shown, an encapsulant 302 covers sides and a lower surface of a circuit stack 311, but leaves electronic components 310 and the surface to which the electronic components 310 are attached exposed. This may be beneficial in implementations where encapsulation may harm the electronic components 310, where encapsulation of the electronic components 310 is not helpful because they are internal to an electronic device, where easier access to the electronic components 310 is desired, and so on.

Figure 4:
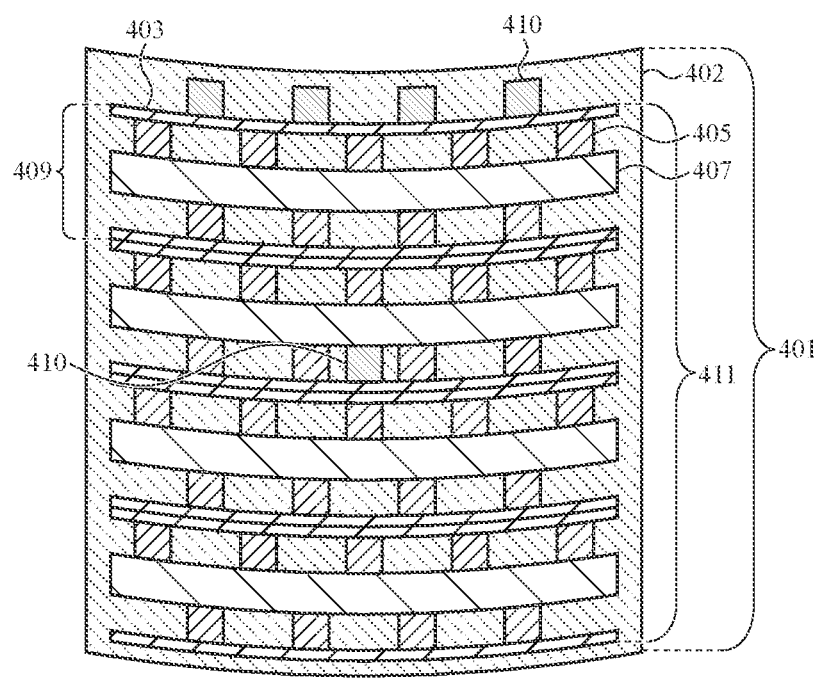
FIG. 4 depicts an embodiment of a three-dimensional circuit laminate structure, like that of FIG. 2F or 2G, in which an electronic component is disposed within the circuit stack.

By way of another example, the above illustrates and describes the electronic components 210 of FIGS. 2A-2B as coupled to a top surface of the circuit stack 211. However, FIG. 4 depicts an embodiment of a three-dimensional circuit laminate structure 401 like that of FIG. 2F or 2G where an electronic component 410 is disposed within the circuit stack 411. Electronic components 410 may be disposed anywhere in the circuit stack 411 in various implementations for a variety of different purposes and being able to locate components in places other than a surface of the circuit stack 411 provides greater flexibility in accomplishing those different purposes.

Figure 5:
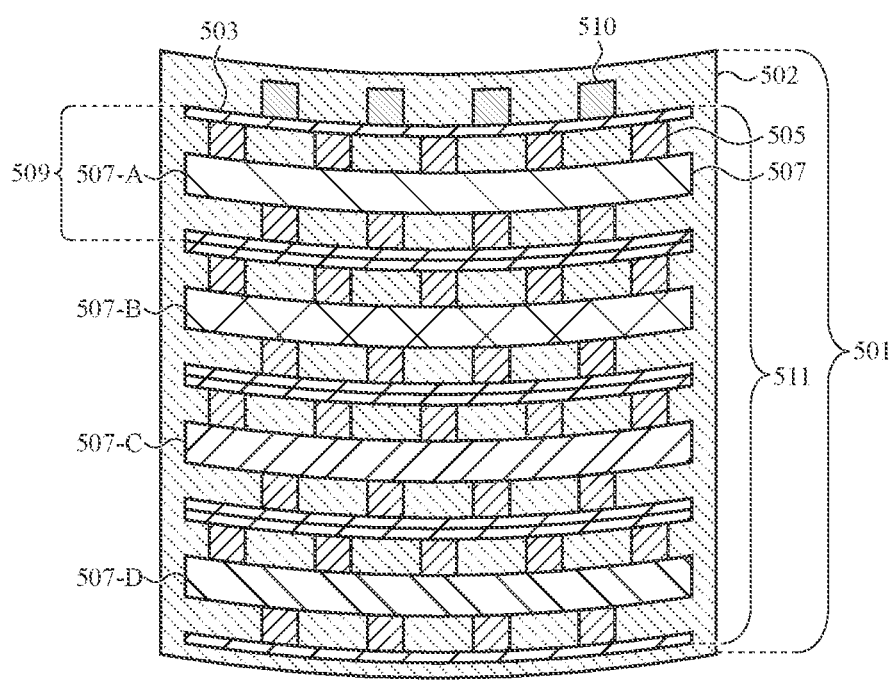
FIG. 5 depicts an embodiment of a three-dimensional circuit laminate structure, like that of FIG. 2F or 2G, in which the three-dimensional circuit laminate structure includes multiple different kinds of structural layers.

In still another example, the above indicates that the different structural layers 207 are similarly formed of similar materials. However, FIG. 5 depicts an embodiment of a three-dimensional circuit laminate structure 501 like that of FIG. 2F or 2G where the three-dimensional circuit laminate structure 501 includes multiple different kinds of structural layers 507A-507D. The structural layers 507A-507D may be formed in various different ways from various different materials. For example, in some implementations, the structural layer 507A may be a flexible, electrically non-conductive metal layer; the structural layer 507B may be woven carbon fiber; the structural layer 507C may be para-aramid fiber; and the structural layer 507D may be prepreg. The structural layers 507A-507D, and/or other components, may have different thermal conductivity properties. Various arrangements are possible and contemplated.

Figure 6:
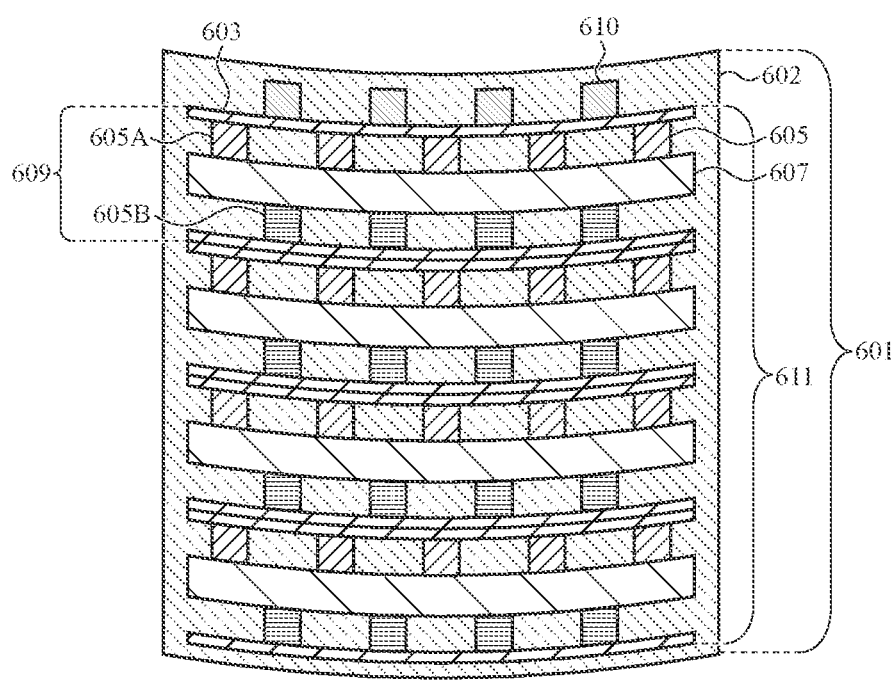
FIG. 6 depicts an embodiment of a three-dimensional circuit laminate structure, like that of FIG. 2F or 2G, in which the three-dimensional circuit laminate structure includes multiple different kinds of conductive traces.

In yet another example, the above indicates that the different conductive traces 205 are similarly formed of similar materials. However, FIG. 6 depicts an embodiment of a three-dimensional circuit laminate structure 601 like that of FIG. 2F or 2G where the three-dimensional circuit laminate structure 601 includes multiple different kinds of conductive traces 605A, 605B. The conductive traces 605A, 605B may be formed in various different ways from various different materials. For example, in some implementations, the conductive trace 605A may be formed of flexible and stretchable conductive copper ink whereas the conductive trace 605B may be formed of flexible and stretchable conductive silver ink. In some situations, different materials may be used for different functions, such as where flexible conductive copper ink is used for radio frequency function components and flexible conductive silver ink is used for other components. Various arrangements are possible and contemplated.

Figure 7:
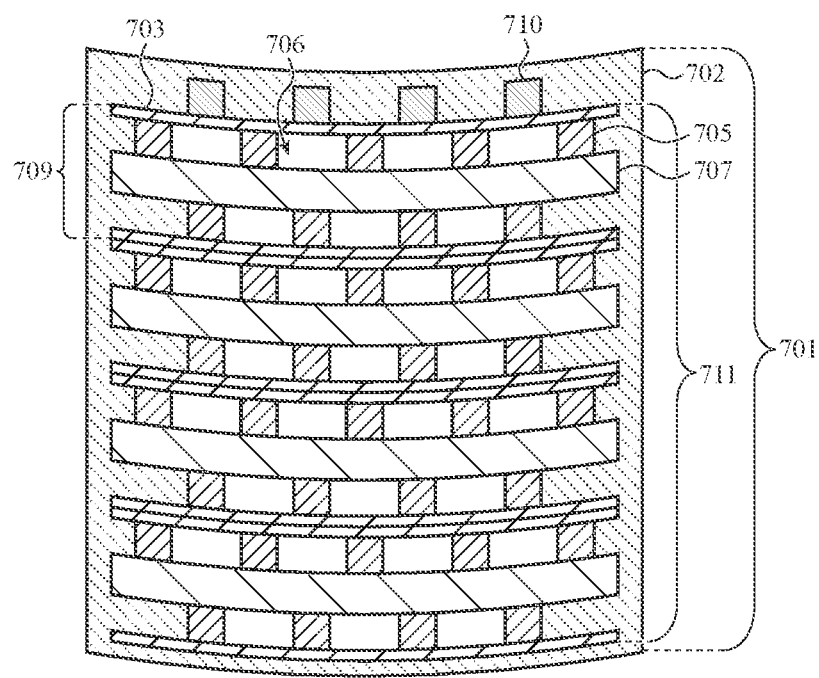
FIG. 7 depicts an embodiment of a three-dimensional circuit laminate structure, like that of FIG. 2F or 2G, in which an encapsulant that at least partially covers, coats, or otherwise encapsulates the circuit stack of the three-dimensional circuit laminate structure leaves gaps within the circuit stack.

By way of other examples, the above illustrates and describes the encapsulant 202 filling the gaps 206. However, FIG. 7 depicts an embodiment of a three-dimensional circuit laminate structure 701 like that of FIG. 2F or 2G where an encapsulant 702 that at least partially covers, coats, or otherwise encapsulates the circuit stack 711 of the three-dimensional circuit laminate structure 701 leaves gaps 706 within the circuit stack 711. These gaps 706 may reduce weight where the encapsulant 702 would not function to protect components from external contaminants, allow for air bubbles for purposes of buoyancy, protect sensitive components that might otherwise be damaged during encapsulation, and/or accomplish various other purposes.

Figure 8:
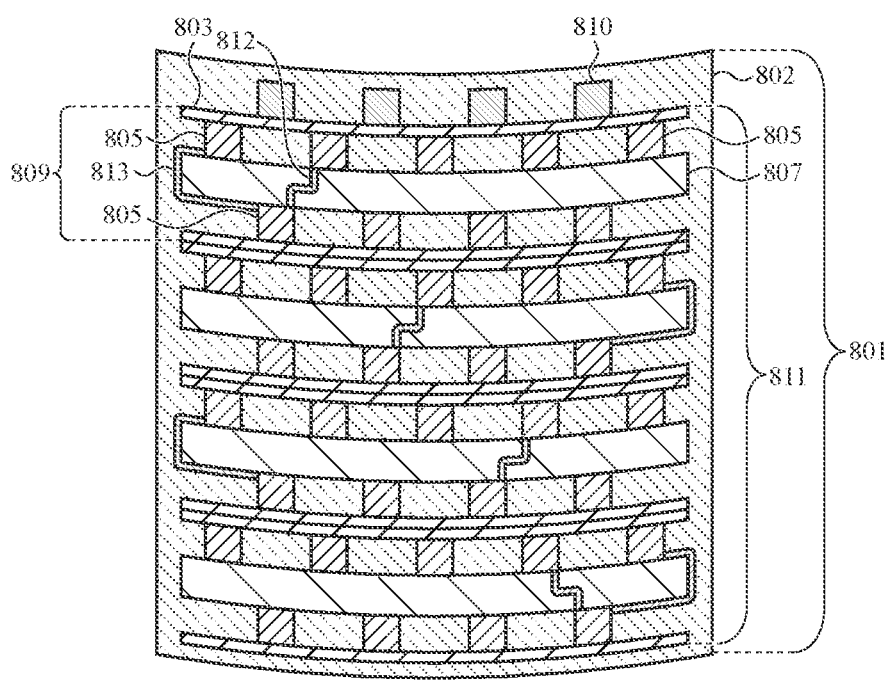
FIG. 8 depicts an embodiment of a three-dimensional circuit laminate structure like that of FIG. 2F or 2G illustrating mechanisms that electrically connect various stack layers.

Further, for purposes of simplicity FIGS. 2A-2G do not illustrate electrical connections formed between various circuit stack layers 209, flexible conductive traces 205, and/or flexible connector layers 203. However, in various implementations, one or more vias or other conductive materials may be included that link various (adjacent, non-adjacent, and so on) circuit stack layers 209, flexible conductive traces 205, and/or flexible connector layers 203. For example, FIG. 8 depicts an embodiment of a three-dimensional circuit laminate structure 801 like that of FIG. 2F or 2G illustrating mechanisms that electrically connect various stack layers. By way of example, vias 812 may be formed through one or more structural layers 807 to connect flexible conductive traces 805 on opposing surfaces of the structural layers 807. By way of another example, conductive material 813 may extend around one or more structural layers 807 to connect flexible conductive traces 805 on opposing surfaces of the structural layers 807. Various electrical connection mechanisms are possible and contemplated for variously electrically connecting various layers 809, flexible conductive traces 805, flexible connector layers 803, and so on.

Figure 9:
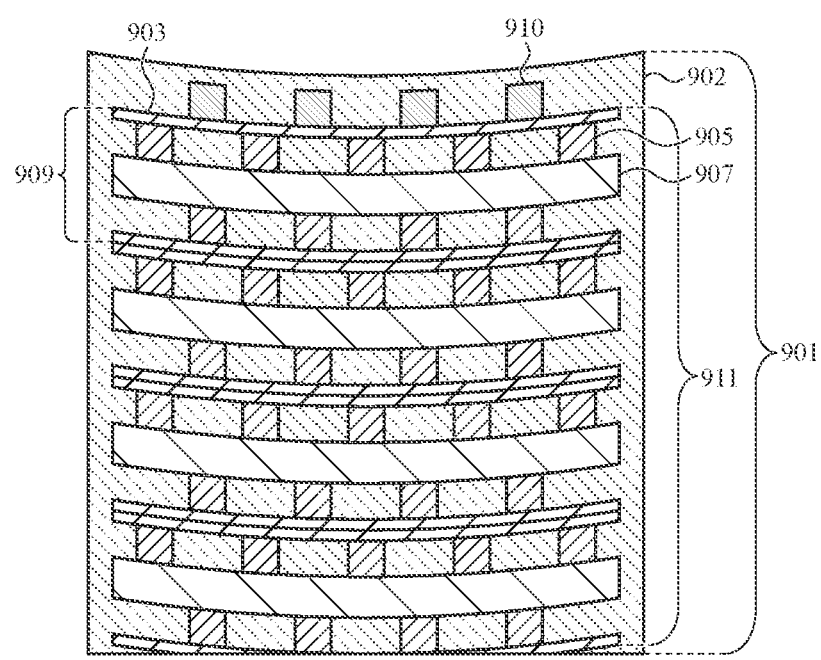
FIG. 9 depicts an embodiment of a three-dimensional circuit laminate structure, like that of FIG. 2F or 2G, in which a portion of the three-dimensional circuit laminate structure is removed to form a flat surface.

By way of still another example, one or more additional operations may be performed in addition to those illustrated and described above without departing from the scope of the present disclosure. In some implementations, one or more portions of the three-dimensional circuit laminate structure 201 and/or the circuit stack 211 may be removed. For example, FIG. 9 depicts an embodiment of a three-dimensional circuit laminate structure 901 like that of FIG. 2F or 2G where a portion of the three-dimensional circuit laminate structure 901 is removed to form a flat surface. This may allow external exposure of internal conductive material such as flexible conductive traces 905 or flexible connector layers 903, shaping of the three-dimensional circuit laminate structure 901 and/or the circuit stack 911 such as to provide a flat bottom surface, and so on. Various configurations and arrangements are possible and contemplated.

Additionally, the above is illustrated and described with respect to FIGS. 2A-2G as processing (such as by thermoforming or other co-molding) the structural layers 207 so that they are at least relatively more rigid and stiff than prior to processing. This allows the structural layers 207 to provide strength to an enclosure or support structure formed therefrom. However, in various implementations, formation of the three-dimensional circuit laminate structure 201 and/or the circuit stack 211 may leave the structural layers 207 flexible. The three-dimensional circuit laminate structure 201 and/or the circuit stack 211 may thus be used to form various flexible electrical connection mechanisms and/or flexible circuits.

Further, the circuit stack 211 is illustrated and described with the circuit stack layers 209 configured in a particular orientation. However, various configurations of various layers may be used for a variety of different purposes, such as providing a stack with strength, particular dimensions, rigidity, and so on. Various arrangements are possible and contemplated without departing from the scope of the present disclosure.

Moreover, although the circuit stack 211 is illustrated and described with each circuit stack layer 209 including a structural layer 207, flexible conductive traces 205 formed on opposing surfaces of the structural layer 207, and flexible connector layers 203 connected to the flexible conductive traces 205 that separate the circuit stack layers 209, it is understood that this is an example. Individual circuit stack layers 209 may be configured differently while still providing structural support and electrical connection within a stack or other arrangement without departing from the scope of the present disclosure. For example, in some implementations, the flexible connector layer 203 may be omitted and flexible conductive traces 205 and/or other conductors may connect different circuit stack layers 209.

By way of another example, in some implementations, an electrically non-conductive metal layer (such as a flexible, electrically non-conductive metal layer) may be coupled to the structural layer 207 and/or other components of one or more of the circuit stack layers 209. Such a flexible, electrically non-conductive metal layer may form a substrate or carrier for the circuit stack 211, provide an exterior surface for the circuit stack 211 (such as the exterior surface of an enclosure or housing), shield one or more components of the circuit stack 211, and/or perform various other functions for the circuit stack 211.

Additionally, although the above is illustrated and described with respect to FIGS. 2A-2G as including various components configured in various arrangements, it is understood that these are examples. In various embodiments, various arrangements of the same, similar, and/or different components may be configured in various ways without departing from the scope of the present disclosure.

In some embodiments, a circuit laminate may include first and second layers coupled together. Each of the first and second layers may include rigid, electrically insulating non-planar structural layer that reinforces a housing or internal component of an electronic device, the rigid, electrically insulating non-planar structural layer having opposing first and second surfaces; flexible conductive traces disposed on the first and second surfaces; and first and second flexible connector layers respectively contact the flexible conductive traces disposed on the first and second surfaces. The circuit laminate may further include an encapsulant that surrounds at least a portion of the first and second layers.

In various examples, the rigid, electrically insulating non-planar structural layer includes at least one of carbon fiber, aramid fiber, glass-reinforced epoxy, fiber reinforced plastic, or prepreg. In numerous examples, the flexible conductive traces include conductive silver ink or conductive copper ink. In some examples, the first and second flexible connector layers include a metal foil or film. In various examples, the rigid, electrically insulating non-planar structural layer of the first layer includes a different material than the rigid, electrically insulating non-planar structural layer of the second layer. In numerous examples, the circuit laminate defines a curved portion of the housing.

In numerous embodiments, an enclosure for an electronic device includes a first structural layer, a first flexible conductive trace formed on the first structural layer, a second structural layer, a second flexible conductive trace formed on the second structural layer, and a flexible connector layer disposed between the first and second flexible conductive traces separating the first and second layers. The first and second structural layers stiffen the enclosure.

In some examples, an electronic component is coupled to the enclosure and electrically coupled to at least one of the first flexible conductive trace, the second flexible conductive trace, or the flexible connector layer. In various examples, the enclosure further includes an electrically non-conductive material that encapsulates at least part of the first structural layer or the second structural layer. In numerous examples, the enclosure further includes a flexible, electrically non-conductive metal layer coupled to the first structural layer.

In various examples, at least one of the first and second flexible conductive traces includes conductive ink. In numerous examples, the first structural layer and the second structural layer are non-planar.

In some embodiments, a method for forming a circuit assembly includes forming a first sheet by providing a first structural layer, printing first circuit traces on the first structural layer, and contacting a first connector layer to the first circuit traces. The method also includes forming a second sheet by providing a second structural layer, printing second circuit traces on the second structural layer, and contacting a second conductive connector layer to the second circuit traces. The method additionally includes thermoforming the first and second sheets to create a circuit laminate.

In some examples, thermoforming the first and second sheets to create the circuit laminate further includes thermoforming the first and second sheets to create a non-planar circuit laminate. In various examples, the method further includes covering at least a portion of the first and second sheets with an electrically insulating material. The covering may be performed subsequent to the thermoforming.

In numerous examples, the method further includes electrically connecting an electronic component to the first circuit traces. In various examples, the thermoforming configures the circuit laminate as a structural component. In some examples, the method further includes removing a portion of the circuit laminate.

Figure 10:
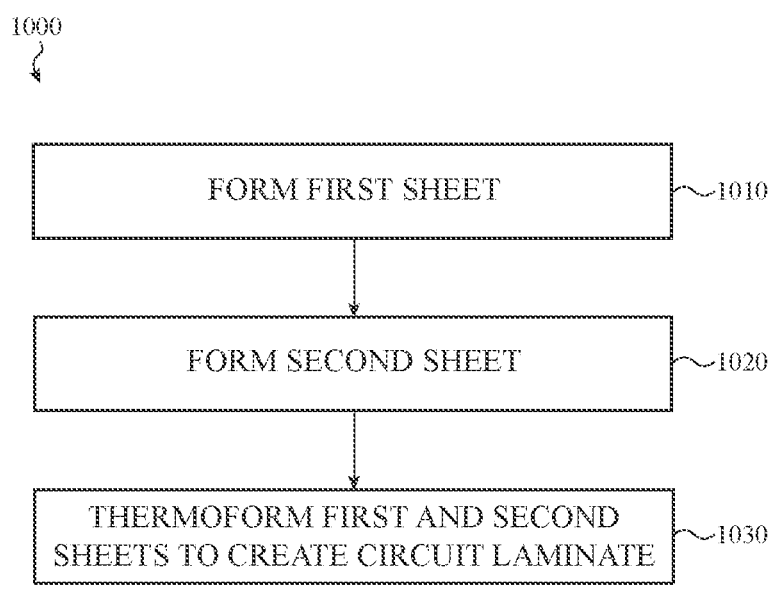
FIG. 10 is a flow chart illustrating a first example method for forming a three-dimensional circuit laminate.

FIG. 10 is a flow chart illustrating a first example method 1000 for forming a three-dimensional circuit laminate. This first example method 1000 may form the housing 101 or enclosure of FIGS. 1A-1C and/or the three-dimensional circuit laminate structures 201-901 of FIGS. 2F, 2G, and/or 3-9.

At 1010, a first sheet is formed. The first sheet may be formed by providing a first structural layer, printing first circuit traces on the first structural layer, and contacting a first connector layer to the first circuit traces. The first circuit traces may be formed of a stretchable or flexible conductive material, such as a stretchable or flexible conductive ink.

At 1020, a second sheet is formed. The second sheet may by formed by providing a second structural layer, printing second circuit traces on the second structural layer, and contacting a second conductive connector layer to the second circuit traces. The second circuit traces may be formed of a stretchable or flexible conductive material, such as a stretchable or flexible conductive ink.

At 1030, the first and second sheets may be thermoformed and/or otherwise processed to couple the first and second sheets to form a non-planar circuit laminate. The thermoforming may cause the first and/or second sheets (and/or a portion thereof) to become more rigid or stiff. This may allow the non-planar circuit laminate to be used to form a housing, enclosure, or other structural component of a device.

Although the first example method 1000 is illustrated and described as including particular operations performed in a particular order, it is understood that this is an example. In various implementations, various orders of the same, similar, and/or different operations may be performed without departing from the scope of the present disclosure.

For example, 1030 is illustrated and described as thermoforming the first and second sheets to form the non-planar circuit laminate. However, it is understood that this is an example. In various implementations, processes other than thermoforming may be used, more or less sheets may be coupled, the resulting circuit laminate may be planar or flat, and so on. Various arrangements are possible and contemplated.

Figure 11:
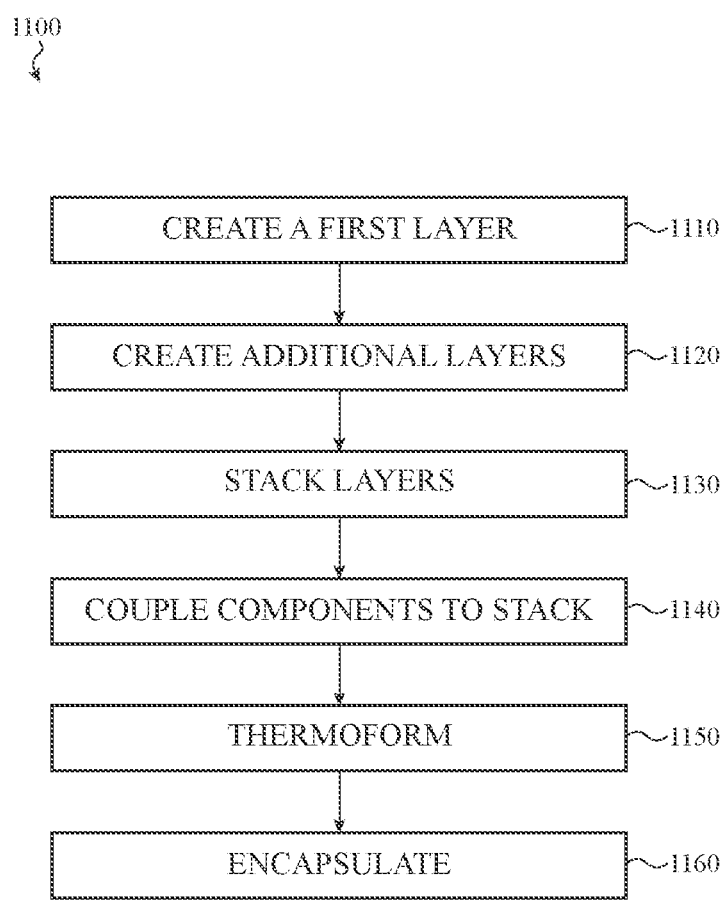
FIG. 11 is a flow chart illustrating a second example method for forming a three-dimensional circuit laminate.

FIG. 11 is a flow chart illustrating a second example method 1100 for forming a three-dimensional circuit laminate. This second example method 1100 may form the housing 101 or enclosure of FIGS. 1A-1C and/or the three-dimensional circuit laminate structures 201-901 of FIGS. 2F, 2G, and/or 3-9.

At 1110, a first layer is created. The first layer may be formed by printing conductive ink on a structural layer and positioning the printed structural layer between connector layers, such as conductive foils and/or films. The conductive ink may be a stretchable and/or flexible conductive ink and may be printed using a three-dimensional printing process. Similarly, the connector layers may be stretchable and/or flexible. In some embodiments, a conductive metal (e.g., copper, silver, nanowire, or the like) may be used instead of a conductive ink to form the traces.

At 1120, one or more additional layers may be created. Such additional layers may be structured the same as, or similarly to, the first layer. For example, the second layer may be formed by printing conductive ink on a structural layer and positioning the printed structural layer between connector layers, such as conductive foils and/or films.

At 1130, the layers may be stacked and/or otherwise brought together. The conductive ink of various layers may form traces and the conductive foil and/or film may be operable to connect the traces of different layers.

At 1140, one or more components may be coupled to the stack. The components may include one or more electronic components. Coupling the components to the stack may include electrically coupling the electrical components to one or more layers of the stack and/or components of the layers. The stack may also include one or more connection mechanisms for electrically connecting layers of the stack and/or components of the layers to various ones of each other.

At 1150, the stack may be thermoformed, such as in a mold. The thermoforming may change the shape of the stack, such as by making a planar stack into a non-planar shaped arrangement (such as including one or more curved portions, bent portions, angled portions, and so on), such as by making the structural layer maintain a non-flat shape. The thermoforming may also make one or more portions of the stack (such as the structural layer) more rigid and/or stiff than prior to the thermoforming.

At 1160, the thermoformed stack may be encapsulated. Encapsulation of the thermoformed stack may encapsulate part or all of the thermoformed stack in one or more polymers, plastics, various electrically non-conductive or electrically insulating materials, and/or other encapsulants.

Although the second example method 1100 is illustrated and described as including particular operations performed in a particular order, it is understood that this is an example. In various implementations, various orders of the same, similar, and/or different operations may be performed without departing from the scope of the present disclosure.

For example, the second example method 1100 is illustrated as coupling components to the stack prior to thermoforming. However, in various examples, components may be coupled to the stack after the stack is thermoformed.

By way of another example, the second example method 1100 is illustrated as thermoforming the stack prior to encapsulation. However, in various examples, the stack may be encapsulated prior to thermoforming. In other examples, the operation of encapsulation may be omitted without departing from the scope of the present disclosure. Various configurations are possible and contemplated.

Figure 12:
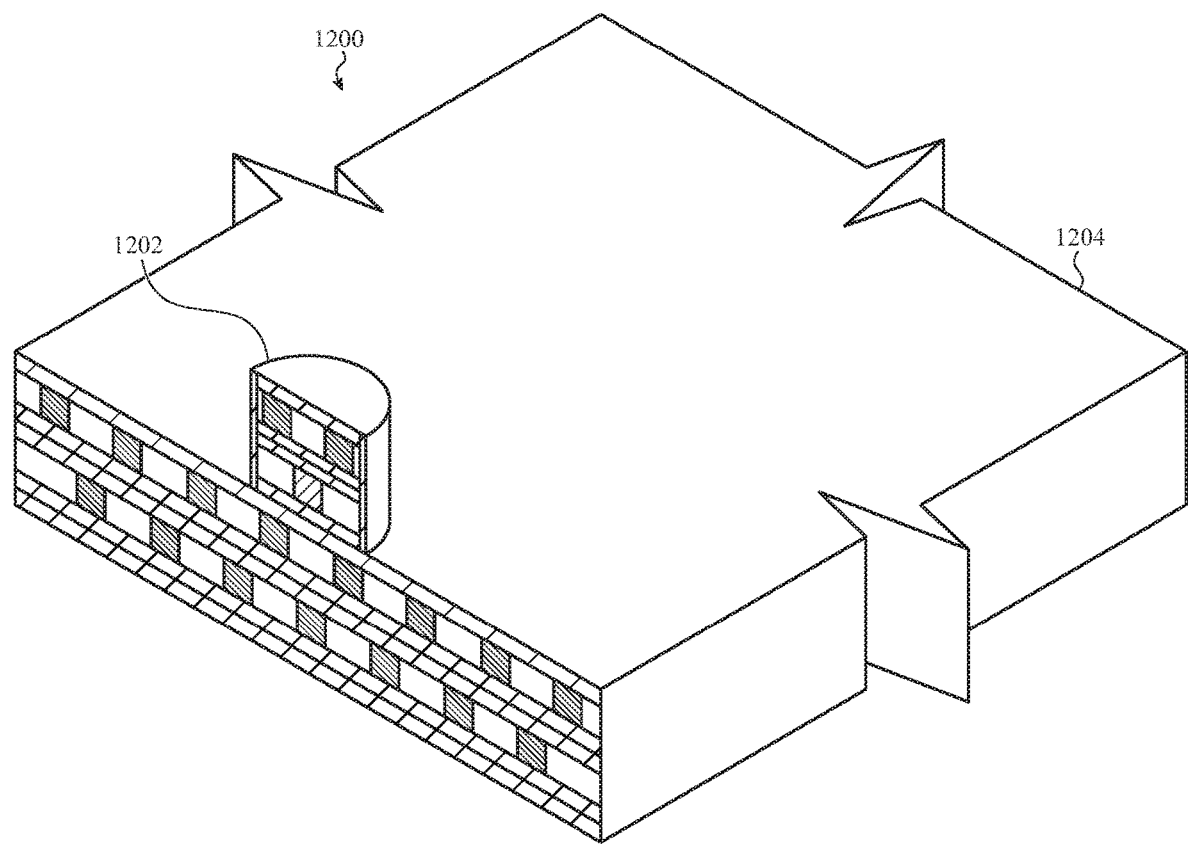
FIG. 12 is a cross-section of a substrate and protrusion formed from a circuit laminate.

FIG. 12 illustrates a multi-level circuit laminate 1200 formed from multiple layers, similar to the embodiments described above. Here, however, the circuit laminate 1200 forms a protrusion 1202 in addition to a substrate 1204. That is, the protrusion is formed from one or more layers of the circuit laminate. Each such layer may form a portion of the protrusion 1202.

It should be appreciated that the protrusion 1202 and substrate 1204 may be integrally formed as part of the same process; suitable forming processes have been previously described. It should be appreciated that embodiments described herein may thus include steps, undercuts, projections, protrusions, and other shapes. Further, such shapes may be integrally formed with the circuit laminate, and of additional circuit layers. Such shapes may include encapsulated electronic components, or may provide electrical connection points for such components.

Figure 13:
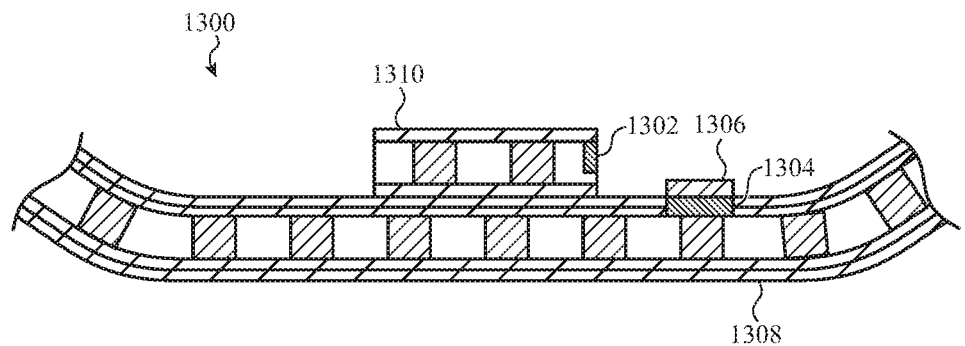
FIG. 13 is a cross-section of a substrate and protrusion formed from a circuit laminate, illustrating electrical connectors in the circuit laminate.

FIG. 13 shows examples of a circuit laminate 1300 that includes multiple electrical connection points 1302, 1304 for electronic components 1306 that are not part of, encapsulated by, or otherwise within the circuit laminate 1300. As shown, the circuit laminate 1300 may form a housing, support plate, midplate, structural element, or other similar support structure 1308. The circuit laminate 1300 may also form a projection 1310, similar to the protrusion 1202 of FIG. 12.

Electrical connectors 1302, 1304 may be formed in or on any portion of the circuit laminate 1300. As shown in FIG. 13, an electrical connector 1302 may be present on a side of a protrusion 1310, or the like. Similarly, an electrical connector 1304 may be formed in the support structure 1308. In either case, the various layers of the circuit laminate may route electrical signals to and from the connector and/or any electrical component 1306 attached to the connector. The connectors may be ports, plugs, pads, or the like.

Figure 14:
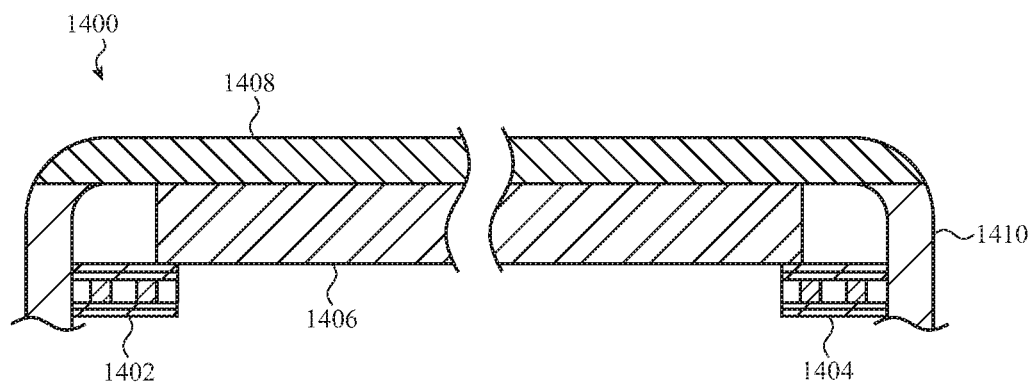
FIG. 14 is a cross-sectional view of a portion of an electronic device, illustrating internal supports formed from circuit laminates.

FIG. 14 illustrates an electronic device 1400 incorporating multiple discrete circuit laminates 1402, 1404. Here, the circuit laminates 1402, 1404 are ledges that support a display 1406 of an electronic device; the display 1406 is positioned beneath a cover glass 1408 of the electronic device 1400. The circuit laminates 1402, 1404 may provide power and/or signal routing to and from various components of the display.

It should be appreciated that the circuit laminates 1402, 1404 are formed from a different material than the housing 1410 in the embodiment of FIG. 14. However, and as discussed with respect to other figures, in some embodiments the circuit laminates 1402, 1404 may be formed contiguously with the housing. In such embodiments the housing may likewise be formed from the circuit laminate.

FIGS. 12-14 generally depict sample structures that may be formed from circuit laminates. The number of layers in each laminate may vary from what is shown in the figures, and so the use of one, two, or more layers is intended to be illustrative rather than limiting. As previously discussed, any structure may be formed with any number of layers. Further, for clarity the layers in FIGS. 12-14 have been simplified. As one example, the stretchable conductor layers are generally not illustrated. It should be appreciated, however, that each layer of the circuit laminates in FIGS. 12-14 are similar to the layers described with respect to FIGS. 1A-12.

As described above and illustrated in the accompanying figures, the present disclosure relates to housings, enclosures, and/or other structures formed of circuit laminates. A circuit laminate may include multiple layers. Each layer may include electrically insulating structural layers. Flexible conductive traces may be formed on the structural layers. Flexible connector layers may be disposed between the flexible conductive traces of different layers. The layers may be coupled together and may be thermoformed or otherwise processed to form a non-planar shape where the structural layers are rigid and/or otherwise stiffen a housing, enclosure, or other structure formed from the circuit laminate. In this way, the circuit laminates may function electrically at the same time that they provide structural support in a variety of non-planar shapes. This may reduce the number of components in an electronic device, reduce the space between components of an electronic device, increase space defined within a housing of an electronic device, and/or otherwise allow for greater flexibility in the selection and design of components of an electronic device.

In the present disclosure, the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   a circuit laminate defining a side wall of the electronic device and an internal volume of the electronic device, the circuit laminate comprising:
   a first structural layer;
   a first flexible conductive trace formed on the first structural layer;
   a second structural layer;
   a second flexible conductive trace formed on the second structural layer;
   a flexible connector layer disposed between the first and second flexible conductive traces and separating the first and second structural layers; and
   an encapsulating material at least partially encapsulating the first structural layer, the second structural layer, and the flexible connector layer and defining an exterior surface of the electronic device;
   a transparent cover coupled to the circuit laminate; and
   a display coupled to the circuit laminate and viewable through the transparent cover.

2. The electronic device of claim 1, wherein the first structural layer and the second structural layer are non-planar.

3. The electronic device of claim 1, further comprising an electronic component that is electrically coupled to at least one of the first flexible conductive trace, the second flexible conductive trace, or the flexible connector layer.

4. The electronic device of claim 1, further comprising an electrically non-conductive material that encapsulates at least part of the first structural layer or the second structural layer.

5. The electronic device of claim 1, wherein at least one of the first or second flexible conductive traces comprises conductive ink.

6. The electronic device of claim 1, wherein at least one of the first structural layer or the second structural layer forms a portion of a protrusion.

7. The electronic device of claim 1, wherein the encapsulating material defines voids within the encapsulating material.

8. The electronic device of claim 1, wherein at least a portion of an internal surface of the circuit laminate opposite the exterior surface of the electronic device is not covered by the encapsulating material.

9. An electronic device, comprising:
   a housing comprising a circuit laminate, the circuit laminate defining a first portion of an exterior surface of the electronic device and an interior cavity of the electronic device, the circuit laminate comprising:
   first and second layers coupled together, the first and second layers each comprising:
   a rigid, electrically insulating non-planar structural layer having opposing first and second surfaces;
   first and second flexible conductive traces respectively disposed on the first and second surfaces;
   first and second flexible connector layers respectively coupled to the first and second flexible conductive traces; and
   an encapsulant that surrounds at least a portion of the first and second layers and defines the first portion of the exterior surface of the electronic device;
   a display at least partially within the interior cavity of the electronic device; and
   a transparent cover coupled to the circuit laminate and defining a second portion of the exterior surface of the electronic device.

10. The electronic device of claim 9, wherein the rigid, electrically insulating non-planar structural layer comprises at least one of carbon fiber, aramid fiber, glass-reinforced epoxy, fiber reinforced plastic, or prepreg.

11. The electronic device of claim 9, wherein the first and second flexible conductive traces comprise conductive silver ink or conductive copper ink.

12. The electronic device of claim 9, wherein the first and second flexible connector layers comprise a metal foil or film.

13. The electronic device of claim 9, wherein the rigid, electrically insulating non-planar structural layer of the first layer comprises a different material than the rigid, electrically insulating non-planar structural layer of the second layer.

14. The electronic device of claim 9, wherein:
   a portion of the housing is curved.

15. A method for assembling an electronic device, comprising:
   forming a first sheet by:
   providing a first structural layer;
   depositing first circuit traces on the first structural layer; and
   placing a first connector layer on the first circuit traces;
   forming a second sheet by:
   providing a second structural layer;
   depositing second circuit traces on the second structural layer; and placing a second connector layer on the second circuit traces;

thermoforming the first and second sheets to create a circuit laminate defining:
  a back exterior wall of an enclosure of the electronic device; and
  a side exterior wall of the enclosure of the electronic device;

covering at least a portion of the first and second sheets with an encapsulant; and coupling the circuit laminate to a transparent cover that defines a front exterior wall of the electronic device.

16. The method of claim 15, wherein thermoforming the first and second sheets to create the circuit laminate comprises thermoforming the first and second sheets to create a non-planar circuit laminate.

17. The method of claim 15, wherein covering at least the portion of the first and second sheets with the encapsulant is performed subsequent to thermoforming the first and second sheets to create the circuit laminate.

18. The method of claim 15, further comprising electrically connecting an electronic component to one of the first circuit traces.

19. The method of claim 15, wherein the thermoforming configures the circuit laminate as a structural component.

20. The method of claim 15, further comprising removing a portion of the circuit laminate.

* * * * *